(12) United States Patent
Kimura et al.

(10) Patent No.: US 11,195,701 B2
(45) Date of Patent: Dec. 7, 2021

(54) SHOWERHEAD

(71) Applicant: Sumitomo Electric Industries, Ltd., Osaka (JP)

(72) Inventors: Koichi Kimura, Itami (JP); Akira Mikumo, Itami (JP); Shigenobu Sakita, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 112 days.

(21) Appl. No.: 16/605,136

(22) PCT Filed: Apr. 4, 2018

(86) PCT No.: PCT/JP2018/014403
§ 371 (c)(1),
(2) Date: Oct. 14, 2019

(87) PCT Pub. No.: WO2018/190218
PCT Pub. Date: Oct. 18, 2018

(65) Prior Publication Data
US 2021/0027988 A1    Jan. 28, 2021

(30) Foreign Application Priority Data
Apr. 14, 2017   (JP) .............................. JP2017-080310

(51) Int. Cl.
*H01J 37/32* (2006.01)
*C23C 16/455* (2006.01)
(Continued)

(52) U.S. Cl.
CPC .... *H01J 37/3244* (2013.01); *C23C 16/45565* (2013.01); *C23C 16/509* (2013.01); *H01J 37/32082* (2013.01); *H05B 3/283* (2013.01); *H01J 2237/3321* (2013.01); *H05B 2203/016* (2013.01)

(58) Field of Classification Search
CPC ............. H01J 37/3244; H01J 37/32082; H01J 2237/3321; C23C 16/505; C23C 16/509; C23C 16/5096; C23C 16/4557; C23C 16/45565; C04B 35/581; H01L 21/31; H01L 21/205; H01L 21/3065; H05B 3/283; H05B 2203/016
See application file for complete search history.

(56) References Cited

U.S. PATENT DOCUMENTS 6,460,482 B1 * 10/2002 Kuibira ................. C23C 16/455
118/723 E

FOREIGN PATENT DOCUMENTS

JP    2001-274103 A    10/2001
JP    2003-524895 A    8/2003
(Continued)

*Primary Examiner* — Yuechuan Yu
(74) *Attorney, Agent, or Firm* — Baker Botts L.L.P.; Michael A. Sartori

(57) ABSTRACT

A showerhead provided in a chamber of a semiconductor manufacturing apparatus and facing a wafer holder includes: a plate-shaped ceramic substrate; a plurality of through holes penetrating the ceramic substrate in the direction of the thickness of the ceramic substrate; and a plurality of radio frequency conductors embedded in a plurality of zones, respectively, of the ceramic substrate, as seen on the side of a surface of the ceramic substrate facing the wafer holder.

8 Claims, 16 Drawing Sheets

(51) Int. Cl.
*C23C 16/509* (2006.01)
*H05B 3/28* (2006.01)

(56) References Cited

FOREIGN PATENT DOCUMENTS

| | | | |
|---|---|---|---|
| JP | 2005-123159 | A | 5/2005 |
| JP | 2005123159 | A * | 5/2005 |
| JP | 2008-294016 | A | 12/2008 |
| JP | 2008-294017 | A | 12/2008 |
| JP | 2009-218485 | A | 9/2009 |
| JP | 2014-170742 | A | 9/2014 |
| WO | 01/63642 | A1 | 8/2001 |

* cited by examiner

VIEW TAKEN ALONG ARROW A1-A1

VIEW TAKEN ALONG ARROW A2-A2

VIEW TAKEN ALONG ARROW B2-B2

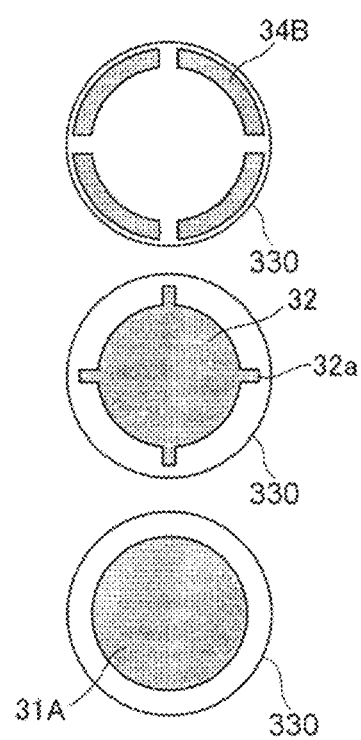

VIEW TAKEN ALONG ARROW A5-A5

VIEW TAKEN ALONG ARROW B5-B5

SHOWERHEAD

TECHNICAL FIELD

The present disclosure relates to a showerhead. The present application claims priority based on Japanese Patent Application No. 2017-080310 filed on Apr. 14, 2017, and incorporates herein all the contents described in the Japanese Patent Application.

BACKGROUND ART

In semiconductor manufacturing apparatuses for manufacturing semiconductor devices such as LSIs, a semiconductor wafer is placed on a wafer holder, also referred to as a susceptor, introduced in a chamber, and, while having a back surface heated, has a front surface subjected to a variety of types of thin film processing such as CVD, sputtering and other deposition processes, etching, and the like. Such thin film processing may be performed in a plasma atmosphere, and a semiconductor manufacturing apparatus therefor is provided with radio frequency (RF) electrodes, with one (or a lower) electrode embedded in the wafer holder and the other (or an upper) electrode above the wafer holder to face the lower electrode. Radio frequency (RF) voltage is applied between the electrodes to make a source gas present between the electrodes into a plasma state.

The above semiconductor manufacturing apparatus is provided with a showerhead above the wafer holder in order to introduce the source gas into the chamber. A portion of the showerhead facing a wafer carrying surface of the wafer holder is formed by a disk-shaped member provided with a large number of gas discharging holes so that the source gas can be uniformly supplied toward the wafer carrying surface of the wafer holder. Embedding a conductive member in the disk-shaped member for a radio frequency electrode allows the showerhead to also serve as the upper electrode. For example, PTL 1 discloses that an upper electrode circuit for generating a radio frequency wave is embedded in a ceramic plate for a showerhead having a plurality of through holes and a metal support holding the ceramic plate and the upper electrode circuit are electrically connected by using a spring.

CITATION LIST

Patent Literature

PTL 1: Japanese Patent Laying-Open No. 2008-294017

SUMMARY OF INVENTION

A showerhead provided in a chamber of a semiconductor manufacturing apparatus and facing a wafer holder comprises: a plate-shaped ceramic substrate; a plurality of through holes penetrating the ceramic substrate in the direction of the thickness of the ceramic substrate; and a plurality of radio frequency conductors embedded in a plurality of zones, respectively, of the ceramic substrate, as seen on the side of a surface of the ceramic substrate facing the wafer holder.

BRIEF DESCRIPTION OF DRAWINGS

FIG. 9C is an example of an alternative to the showerhead of the third embodiment in a view along an arrow, similarly as seen in FIG. 8B.

DETAILED DESCRIPTION

Figure 1A:
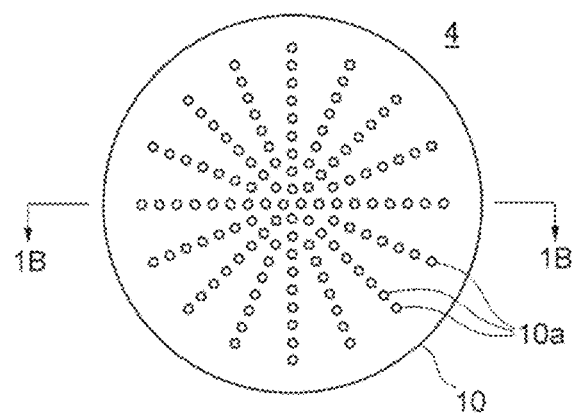
FIG. 1A is a schematic plan view of a showerhead according to a first embodiment.

As has been set forth above, providing a showerhead with an upper electrode such that the upper electrode is embedded in a disk-shaped member of the showerhead having a plurality of gas discharging holes can simplify a structure above a wafer holder. However, a semiconductor manufacturing apparatus has a chamber with a side wall having a portion provided with a load lock or the like for loading and unloading a semiconductor wafer, and accordingly, the wafer holder's surroundings are not uniform and a plasma generated in a space between the wafer holder and the showerhead may be locally inhomogeneous. As a result, a local difference occurs in thin film processing of a surface of the semiconductor wafer, which may cause variation in quality of semiconductor devices.

The present disclosure has been made in view of such conventional circumstances, and an object thereof is to provide a showerhead capable of locally adjusting the characteristics of a plasma generated in a space between the wafer holder and the showerhead.

Initially, embodiments of the present disclosure will be enumerated and specifically described. According to the present disclosure, a showerhead is provided in a chamber of a semiconductor manufacturing apparatus opposite to a wafer holder, and comprises: a plate-shaped ceramic substrate; a plurality of through holes penetrating the ceramic substrate in the direction of the thickness of the ceramic substrate; and a plurality of radio frequency conductors embedded in a plurality of zones, respectively, of the ceramic substrate, as viewed on the side of a surface of the ceramic substrate facing the wafer holder. This allows local adjustment of the characteristics of a plasma generated in a space between the wafer holder and the showerhead.

The showerhead in an embodiment may have the plurality of conductors embedded in the ceramic substrate at different positions, respectively, as seen in the direction of the thickness of the ceramic substrate. This can enhance a degree of freedom in designing the shape of each conductor, the location of a portion feeding power thereto, the number of conductors, the number of power feeding portions, and the like.

The showerhead in an embodiment may further comprise: a lead-out circuit embedded in the ceramic substrate at a position different from that of at least one of the plurality of conductors as seen in the direction of the thickness of the ceramic substrate, and electrically connected to the at least one conductor; and a terminal portion disposed at a circumferential portion of the ceramic substrate and electrically connected to the at least one conductor via the lead-out circuit. Thus can eliminate a local, electrical load on the portion supplying the conductor with power in supplying the conductor with power.

The showerhead in one embodiment may further comprise a resistive, heat generating element embedded in the ceramic substrate. This allows a plasma to be adjusted in temperature. The resistive, heat generating element may be embedded in the ceramic substrate at a position different from that of at least one of the plurality of conductors as seen in the direction of the thickness of the ceramic substrate. This can enhance a degree of freedom in designing the shape of each conductor, the shape of the resistive, heat generating element, the location of a portion feeding them with power, the number of conductors, the number of resistive, heat generating elements, and the like.

Figure 1B:
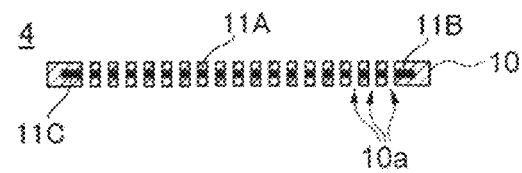
FIG. 1B is a cross section taken along a line 1B-1B indicated in FIG. 1A.
Figure 14:
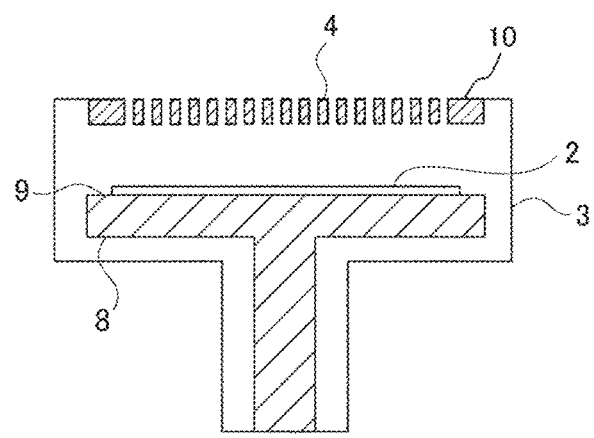
FIG. 14 is a schematic cross section of a semiconductor manufacturing apparatus.

Hereinafter reference will be made to the drawings to describe a showerhead according to a first embodiment. With reference to FIG. 14, the first embodiment provides a showerhead 4 provided in a chamber 3, in which a semiconductor wafer 2 to be processed is subjected to thin film processing such as plasma CVD in a plasma atmosphere, above a wafer holder 8 holding and heating a semiconductor wafer 2. With reference to FIGS. 1A and 1B, showerhead 4 has a disk-shaped ceramic substrate 10 serving as a gas discharging portion having a thickness of about 3.0 to 10.0 mm and an outer diameter of about 300 to 400 mm. Ceramic substrate 10 is provided with a gas discharging hole 10a which is a through hole penetrating ceramic substrate 10 in the direction of the thickness thereof. Gas discharging hole 10a is of a size with an inner diameter of about 0.1 to 5.0 mm. As shown in FIG. 1A, a plurality of gas discharging holes 10a are provided radially as an example.

Showerhead 4 is provided so as to face a wafer carrying surface 9 of wafer holder 8 in parallel. This allows a plasma generating source gas to be supplied uniformly toward wafer carrying surface 9. Ceramic substrate 10 is formed of material of ceramics, which can be aluminum nitride, silicon nitride, silicon carbide, aluminum oxide, and so forth. Inter alia, aluminum nitride is preferable as it has high thermal conductivity and excellent corrosion resistance.

Figure 2A:
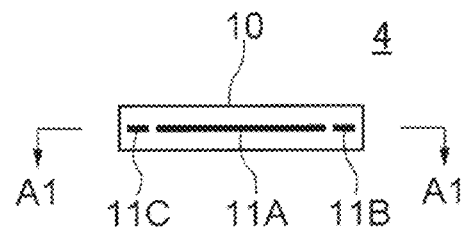
FIG. 2A is a schematic vertical cross section of the showerhead according to the first embodiment.
Figure 2B:
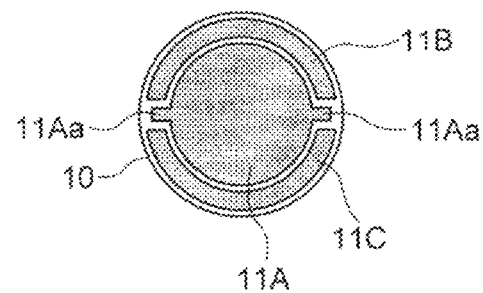
FIG. 2B shows the FIG. 2A showerhead cut along a line A1-A1 and viewed along the arrow.

Referring to FIGS. 2A and 2B, three conductors are embedded in ceramic substrate 10 as an upper electrode of RF electrodes (electrodes for radio frequency). Specifically, an inner conductor 11A and outer conductors 11B and 11C are embedded (hereinafter the inner and outer conductors may each be simply referred to as a conductor). These three conductors 11A to 11C are provided in a single layer located at a substantially central portion of ceramic substrate 10, as seen in the direction of the thickness thereof. These three conductors 11A to 11C are respectively disposed in three zones defined by dividing a surface of ceramic substrate 10 facing wafer holder 3 (hereinafter also referred to as the facing surface) into three. That is, a single inner conductor 11A having a generally circular shape is disposed on the side of the center portion in a layer located generally at a central portion of ceramic substrate 10 as seen in the direction of the thickness thereof, and two outer conductors 11B and 11C each having a shape obtained by dividing an annular shape into two equally in the circumferential direction are disposed to surround inner conductor 11A circumferentially.

A terminal portion (not shown) for supplying power to conductors 11A to 11C is provided at a circumferential portion of ceramic substrate 10. This is because a terminal portion provided at a central portion of ceramic substrate 10 would prevent that portion from having a gas discharging hole and hence prevent a gas from being uniformly discharged. Since the terminal portion is provided at a circumferential portion of ceramic substrate 10, inner conductor 11A is provided with two protrusions 11Aa protruding radially outward, as shown in FIG. 2B. These are respectively located in two gaps present between facing ends of outer conductors 11B and 11C. Terminal portions are connected to these two protrusions 11Aa. Outer conductors 11B and 11C are each located at a circumferential portion of ceramic substrate 10, and can have any portion connected to a terminal portion. In order to be able to apply voltage throughout outer conductors 11B and 11C uniformly, it is preferable that the terminal portion be connected to a central portion as seen in the circumferential direction.

The three conductors 11A to 11C may be formed of any material insofar as it is electrically conductive. The conductors may be formed for example of metal foil such as stainless steel foil or by screen-printing and firing a paste containing tungsten or similar metal powder. As has been described above, ceramic substrate 10 has gas discharging holes 10a which are a plurality of through holes penetrating ceramic substrate 10 in the direction of the thickness thereof, and accordingly, conductors 11A to 11C of showerhead 4 of the first embodiment are provided with an opening at a position corresponding to each gas discharging hole 10a. The same applies to a conductor of showerhead 4 of other embodiments described hereinafter.

As has been described above, showerhead 4 according to the first embodiment of the present disclosure has three conductors 11A to 11C respectively disposed in three zones defined in the facing surface of ceramic substrate 10, and applying RF voltage to the conductors independently allows local adjustment of the characteristics of a plasma generated between showerhead 10 and the wafer holder facing the showerhead. In the first embodiment is described ceramic substrate 10 having the facing surface divided into three zones defined in a pattern shown in FIG. 2B. However, it is not limited as such, and various patterns for division and different numbers of zones are possible.

Figure 3A:
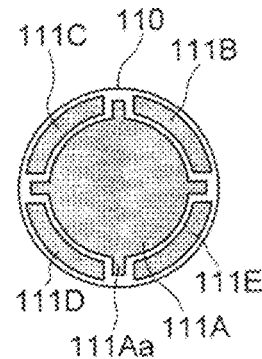
FIG. 3A is an example of an alternative to the showerhead of the first embodiment in a view along an arrow, similarly as seen in FIG. 2B.

For example, FIGS. 3A to 3D show various alternatives to ceramic substrate 10 of the first embodiment described above. That is, FIG. 3A shows a ceramic substrate 110 having the facing surface divided into five zones. More specifically, a single inner conductor 111A having a generally circular shape is disposed on the side of the center portion in a layer located substantially at a central portion of ceramic substrate 110 as seen in the direction of the thickness thereof, and four outer conductors 111B and 111E each having a shape obtained by dividing an annular shape into four equally in the circumferential direction are disposed to surround the inner conductor circumferentially. Inner conductor 111A is provided with four protrusions 111Aa equidistant in the circumferential direction and protruding radially outward, and these are located between facing ends of immediately adjacent outer conductors. And a terminal portion (not shown) is connected to protrusion 111Aa. Each outer conductor has a circumferentially central portion with a terminal portion (not shown) electrically connected thereto.

Figure 3B:
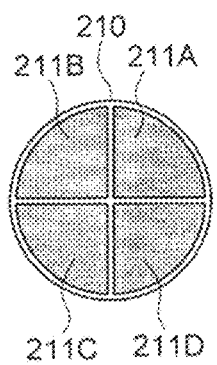
FIG. 3B is an example of an alternative to the showerhead of the first embodiment in a view along an arrow, similarly as seen in FIG. 2B.
Figure 3C:
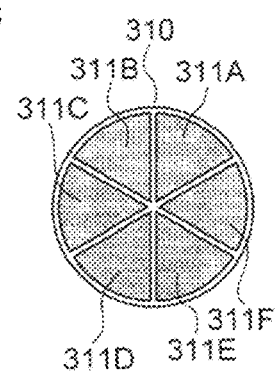
FIG. 3C is an example of an alternative to the showerhead of the first embodiment in a view along an arrow, similarly as seen in FIG. 2B.
Figure 3D:
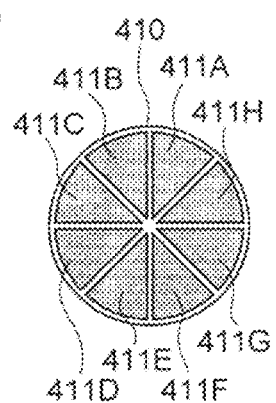
FIG. 3D is an example of an alternative to the showerhead of the first embodiment in a view along an arrow, similarly as seen in FIG. 2B.

While in the examples shown in FIGS. 2A, 2B and 3A the ceramic substrate has the facing surface divided in a pattern into the side of the center portion and an outer circumferential side which is further divided equally in the circumferential direction, in the alternative examples of FIGS. 3B to 3D the ceramic substrate has the facing surface divided in a pattern only equally in the circumferential direction. That is, in the alternative example of FIG. 3B, four conductors 211A to 211D having a sectorial shape having a central angle of 90 degrees are disposed in four zones, respectively, obtained by dividing the facing surface of a ceramic substrate 210 into four equally in the circumferential direction of the surface. In the alternative example of FIG. 3C, six conductors 311A to 311F having a sectorial shape having a central angle of 60 degrees are disposed in six zones, respectively, obtained by dividing the facing surface of a ceramic substrate 310 into six equally in the circumferential direction of the surface. In the alternative example of FIG. 3D, eight conductors 411A to 411H having a sectorial shape having a central angle of 45 degrees are disposed in eight zones, respectively, obtained by dividing the facing surface of a ceramic substrate 410 into eight equally in the circumferential direction of the surface. Dividing the facing surface into a larger number of zones allows a plasma to have more finely adjusted physical properties.

Figure 4A:
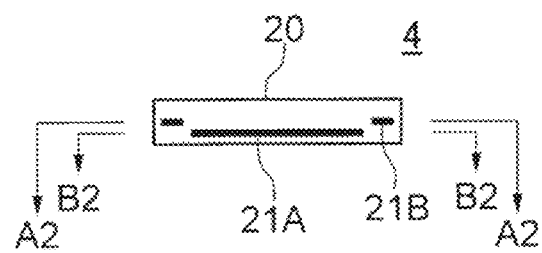
FIG. 4A is a schematic vertical cross section of a showerhead according to a second embodiment.
Figure 4B:
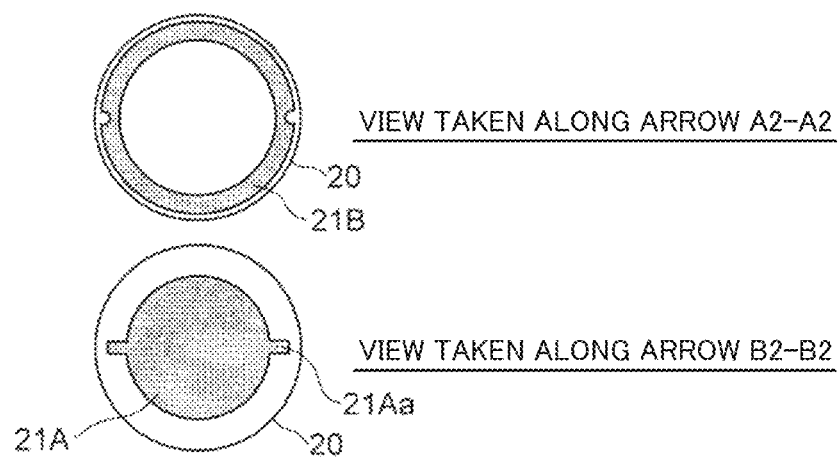
FIG. 4B shows the FIG. 4A showerhead cut along a line A2-A2 and viewed along the arrow, and that cut along a line B2-B2 and viewed along the arrow.

Hereinafter, showerhead 4 according to a second embodiment of the present invention will be described with reference to FIGS. 4A and 4B. As shown in FIG. 4A, showerhead 4 according to the second embodiment includes a ceramic substrate 20 having as an upper electrode of RF electrodes two conductors 21A and 21B embedded in ceramic substrate 20 at different layers, respectively, as seen in the direction of the thickness of the ceramic substrate. That is, as shown in FIG. 4B, inner conductor 21A disposed in ceramic substrate 20 on the side of the center portion and having a generally circular shape is embedded in ceramic substrate 20 at a layer closer to the facing surface than a central portion of the ceramic substrate as seen in the direction of the thickness of the ceramic substrate. In contrast, outer conductor 21B disposed in ceramic substrate 20 on an outer circumferential side and having an annular shape is embedded in ceramic substrate 20 at a layer closer to a surface of the ceramic substrate opposite to the facing surface than the central portion of the ceramic substrate as seen in the direction of the thickness of the ceramic substrate.

Conductors 21A and 21B are fed with power via a terminal portion (not shown), which is provided at a circumferential portion of a ceramic substrate 30, as has been set forth above, and accordingly, conductor 21A is provided with two protrusions 21Aa protruding radially outward for electrical connection therewith. The showerhead of the second embodiment has two conductors embedded in different layers, and protrusion 21Aa never interferes with outer conductor 21B physically. Note, however, that to avoid interfering with the terminal portion connected to protrusion 21Aa, an outer circumferential portion of outer conductor 21B that corresponds thereto is notched to have a curved shape.

Figure 5A:
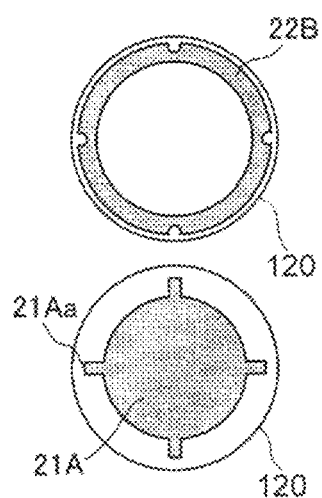
FIG. 5A is an example of an alternative to the showerhead of the second embodiment in a view along an arrow, similarly as seen in FIG. 4B.
Figure 5B:
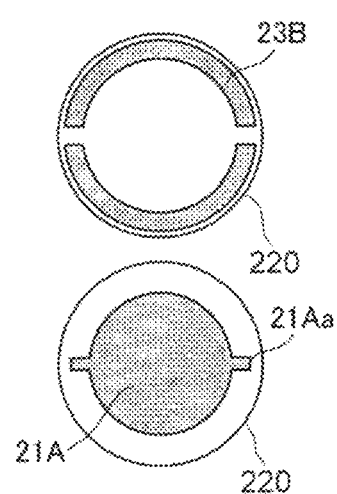
FIG. 5B is an example of an alternative to the showerhead of the second embodiment in a view along an arrow, similarly as seen in FIG. 4B.
Figure 5C:
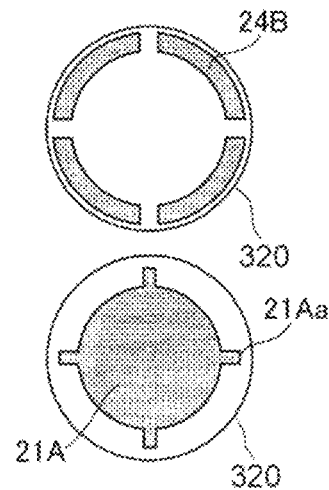
FIG. 5C is an example of an alternative to the showerhead of the second embodiment in a view along an arrow, similarly as seen in FIG. 4B.

While showerhead 4 according to the second embodiment described above has inner conductor 21A provided with two protrusions 21Aa, the showerhead is not limited as such, and, as shown in FIG. 5A showing a ceramic substrate 120, the inner conductor may have four protrusions equidistant in the circumferential direction to be able to more stably receive power. Further, the outer conductor is not limited to the above annular shape, either, and, as shown in FIG. 5B showing a ceramic substrate 220, the annular shape may be divided into two in the circumferential direction, or, as shown in FIG. 5C showing a ceramic substrate 320, the annular shape may be divided into four in the circumferential direction. When the outer conductor is divided in the circumferential direction, as described above, it is preferable to dispose the protrusions of the inner conductor between facing ends of immediately adjacent outer conductors. Thus dividing the ceramic substrate into more zones and disposing a plurality of conductors therein, respectively, allows a plasma to have local characteristics more finely adjusted.

Showerhead 4 shown in FIGS. 4A, 4B and 5A to 5C is such that an inner conductor disposed in a ceramic substrate on the side of the center portion and having a generally circular shape is embedded in ceramic substrate 20 at a layer closer to the facing surface than a central portion of the ceramic substrate as seen in the direction of the thickness of the ceramic substrate and an outer conductor is disposed in ceramic substrate 20 at a layer closer to a surface of the ceramic substrate opposite to the facing surface than the central portion of the ceramic substrate as seen in the direction of the thickness of the ceramic substrate. However, it is not limited as such, and it may be vice versa, as shown in FIGS. 6A and 6B.

Figure 6A:
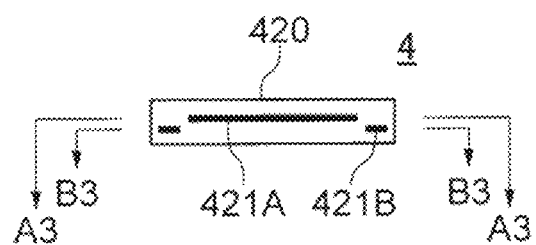
FIG. 6A is a schematic cross section of the FIG. 4A showerhead with first and second layers exchanged.
Figure 6B:
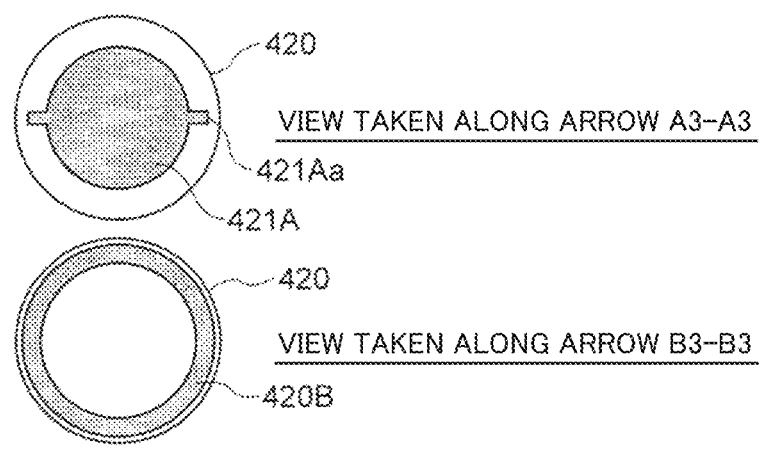
FIG. 6B shows the FIG. 6A showerhead cut along a line A3-A3 and viewed along the arrow, and that cut along a line B3-B3 and viewed along the arrow.

That is, in a ceramic substrate 420 shown in FIG. 6A, a conductor 421A disposed in ceramic substrate 420 on the side of the center portion and having a generally circular shape is embedded in ceramic substrate 420 at a layer closer to a surface of the ceramic substrate opposite to the facing surface than the central portion of the ceramic substrate as seen in the direction of the thickness of the ceramic substrate. In contrast, a conductor 421B disposed in ceramic substrate 420 on an outer circumferential side and having an annular shape is embedded in ceramic substrate 420 at a layer closer to the facing surface than the central portion of the ceramic substrate as seen in the direction of the thickness of the ceramic substrate. By thus embedding outer conductor 421B located in ceramic substrate 420 on the outer circumferential side so as to be in a layer closer to the facing surface, a terminal portion electrically connected to protrusion 421Aa of inner conductor 421A located on the side of the center portion will not physically interfere with outer conductor 421B, and the conductor can be simply shaped.

Figure 7A:
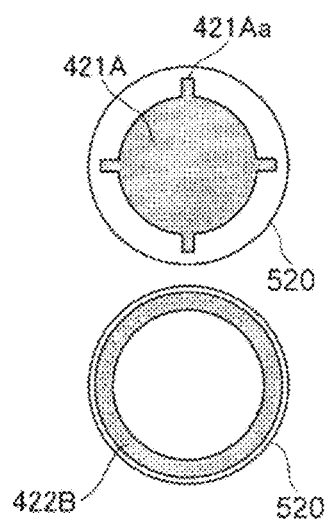
FIG. 7A is an example of an alternative to the FIG. 6A showerhead in a view along an arrow, similarly as seen in FIG. 6B.
Figure 7B:
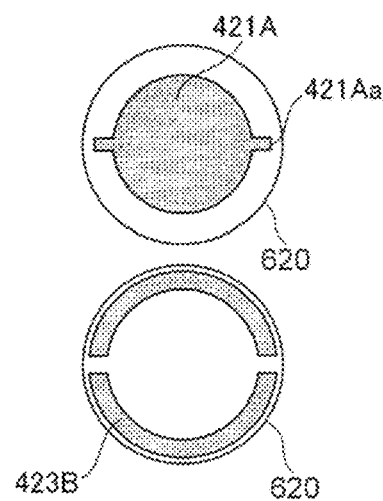
FIG. 7B is an example of an alternative to the FIG. 6A showerhead in a view along an arrow, similarly as seen in FIG. 6B.
Figure 7C:
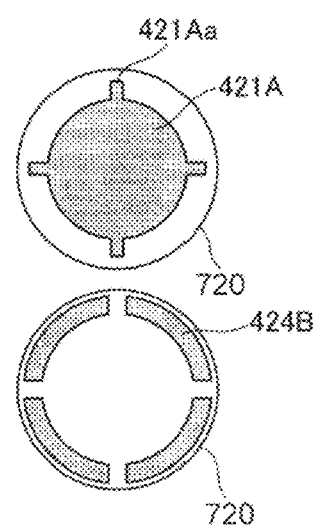
FIG. 7C is an example of an alternative to the FIG. 6A showerhead in a view along an arrow, similarly as seen in FIG. 6B.

The FIG. 6 case may also have an increased number of protrusions or be divided into three or more zones, and for example as shown in FIG. 7A showing a ceramic substrate 520, there may be provided four protrusions equidistant in the circumferential direction to be able to more stably receive power. Further, as shown in FIG. 7B showing a ceramic substrate 620, the annular shape may be divided into two in the circumferential direction, or, as shown in FIG. 7C showing a ceramic substrate 720, the annular shape may be divided into four in the circumferential direction.

Figure 8A:
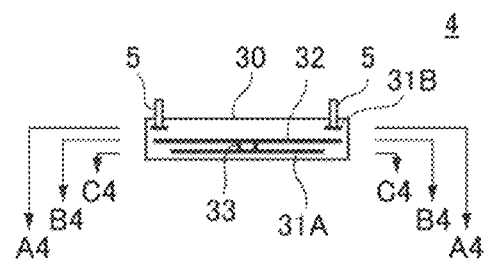
FIG. 8A is a schematic vertical cross section of a showerhead according to a third embodiment.

Hereinafter, showerhead 4 according to a third embodiment of the present disclosure will be described with reference to FIGS. 8A and 8B. As shown in FIG. 8A, a ceramic substrate 30 has for an upper electrode of RF electrodes an inner conductor 31A and an outer conductor 31B embedded in ceramic substrate 30 at different positions, respectively, as seen in the direction of the thickness of the ceramic substrate. A lead-out portion 32, which is a lead-out circuit, is electrically connected to one of the two conductors. Furthermore, a terminal portion 5 is connected to outer conductor 31B. Terminal portion 5 protrudes from ceramic substrate 30.

Figure 8B:
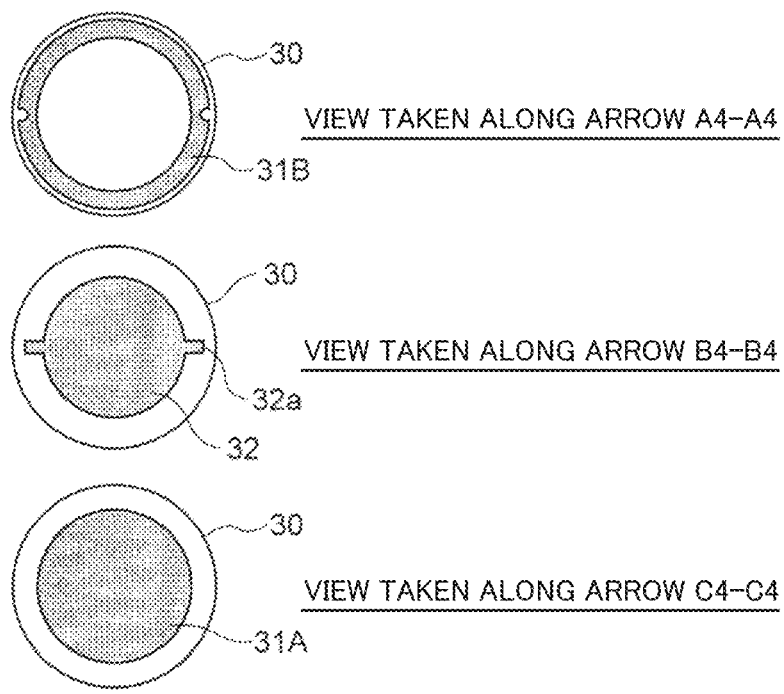
FIG. 8B shows the FIG. 8A showerhead cut along a line A4-A4 and viewed along the arrow, that cut along a line B4-B4 and viewed along the arrow, and that cut along a line C4-C4 and viewed along the arrow.

Specifically, as shown in FIG. 8B, conductor 31A having a generally circular shape is embedded in ceramic substrate 30 at a layer closer to the facing surface than the central portion of the ceramic substrate as seen in the direction of the thickness of the ceramic substrate, on the side of the center portion of the ceramic substrate. In contrast, conductor 31B having an annular shape is embedded in ceramic substrate 30 at a layer closer to a surface of the ceramic substrate opposite to the facing surface than the central portion of the ceramic substrate as seen in the direction of the thickness of the ceramic substrate, on the outer circumferential side of the ceramic substrate. Lead-out portion 32 having a generally circular shape is embedded in ceramic substrate 30 at a layer between the two layers as seen in the direction of the thickness of the ceramic substrate, on the side of the center portion thereof. Lead-out portion 32 is provided with two protrusions 32a equidistant in the circumferential direction and protruding radially outward, and has a center portion electrically connected to inner conductor 31A via a connecting portion 33. A plurality of connecting portions 33 may be provided to be able to distribute their electrical load. Note that a portion of outer conductor 31B corresponding to protrusion 32a has an outer circumferential side notched to have a curved shape to avoid physical interference with the terminal portion in consideration of a case in which the terminal portion is connected to protrusion 32a.

Figure 9A:
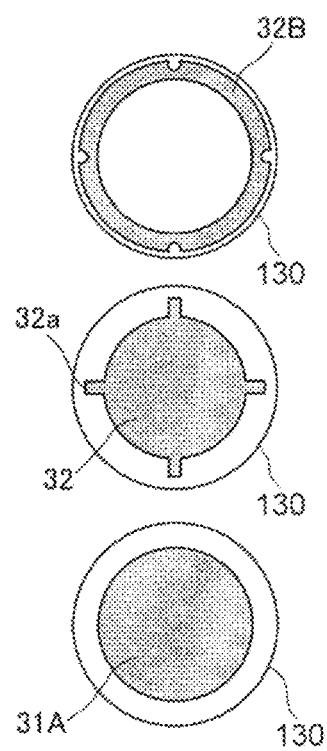
FIG. 9A is an example of an alternative to the showerhead of the third embodiment in a view along an arrow, similarly as seen in FIG. 8B.
Figure 9B:
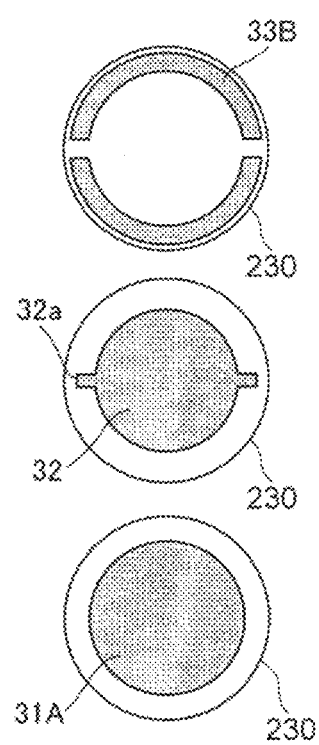
FIG. 9B is an example of an alternative to the showerhead of the third embodiment in a view along an arrow, similarly as seen in FIG. 8B.

While showerhead 4 of the third embodiment described above has lead-out portion 32 provided with two protrusions 32a, it is not limited as such. As shown in FIG. 9A showing a ceramic substrate 130, there may be provided four protrusions equidistant in the circumferential direction to be able to more stably receive power. The outer conductor is not limited to the annular shape, either. As shown in FIG. 9B showing a ceramic substrate 230, the annular shape may be divided into two in the circumferential direction, or, as shown in FIG. 9C showing a ceramic substrate 330, the annular shape may be divided into four in the circumferential direction.

Connecting portion 33 may be formed of any material insofar as it is electrically conductive. As an example, a cylindrical ceramic member having an external surface covered with a metal layer is preferable. The metal layer in this case may be formed by applying a metal paste to the surface of the ceramic member and subsequently degreasing and firing it, or may be a metal sleeve previously formed into a cylindrical shape so as to externally fit the ceramic member. Further, the above ceramic member preferably has a thermal expansion coefficient substantially equal to that of ceramic substrate 30, and more preferably the former is identical in material to the latter. As a result, even when thermal expansion and thermal contraction by heat cycles are repeated, the ceramic member can be expanded and shrunk in the same manner as ceramic substrate 30, so that a problem such as breakage is less likely to occur.

Figure 10A:
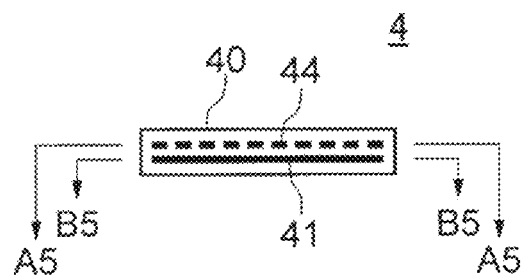
FIG. 10A is a schematic vertical cross section of a showerhead according to a fourth embodiment.
Figure 10B:
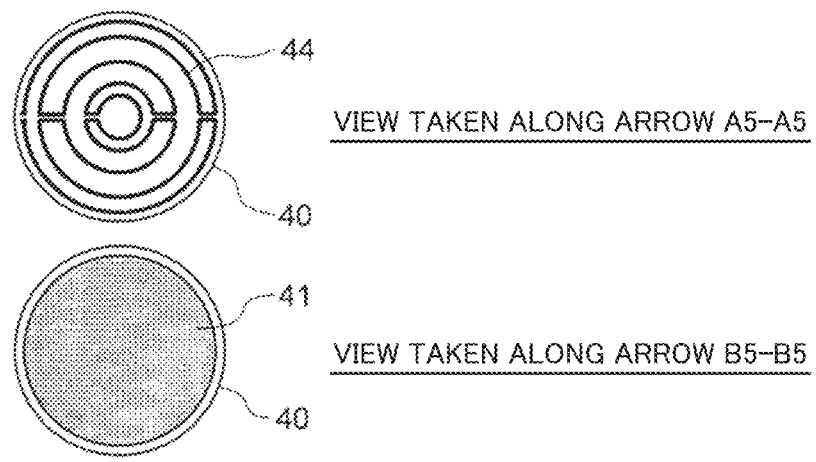
FIG. 10B shows the FIG. 10A showerhead cut along a line A5-A5 and viewed along the arrow, and that cut along a line B5-B5 and viewed along the arrow.

While showerhead 4 according to the first to third embodiments described above is such that only an upper electrode of RF electrodes is embedded in a ceramic substrate, it is not limited as such, and in addition to the upper electrode, a resistive, heat generating element may also be embedded therein. For example, a showerhead according to a fourth embodiment of the present disclosure as shown in FIGS. 10A and 10B has a conductor 41 for an upper electrode embedded in a ceramic substrate 40 at a layer closer to the facing surface than the central portion of the ceramic substrate as seen in the direction of the thickness of the ceramic substrate, and a single resistive, heat generating element 44 embedded in ceramic substrate 40 at a layer closer to a surface of the ceramic substrate opposite to the facing surface than the central portion of the ceramic substrate as seen in the direction of the thickness of the ceramic substrate. Specifically, heat generating resistor 44 has a circuit pattern in which a plurality of concentric curved portions and a plurality of straight portions connecting adjacent ones of the concentric curved portions are connected in a single stroke, and it is embedded in ceramic substrate 40 at the layer closer to the surface of the ceramic substrate opposite to the facing surface than the central portion of the ceramic substrate as seen in the direction of the thickness of the ceramic substrate, substantially throughout a plane excluding gas discharging holes 10a and the circumferential portion. Heat generating resistor 44 has opposite ends electrically connected to a terminal portion (not shown).

Figure 11A:
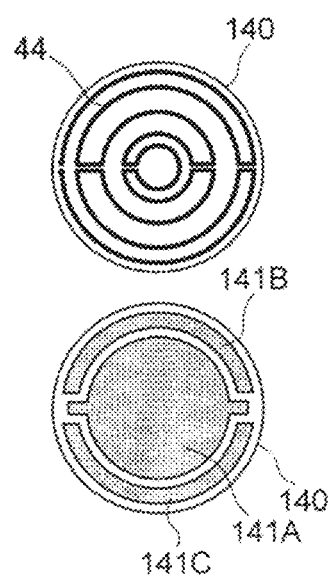
FIG. 11A is an example of an alternative to the showerhead of the fourth embodiment in a view along an arrow, similarly as seen in FIG. 10B.
Figure 11B:
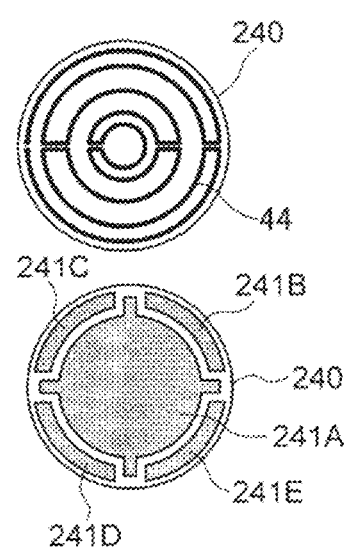
FIG. 11B is an example of an alternative to the showerhead of the fourth embodiment in a view along an arrow, similarly as seen in FIG. 10B.

While showerhead 4 according to the fourth embodiment described above has a single conductor embedded in a ceramic substrate as an upper electrode of RF electrodes, it is not limited as such, and as shown in FIG. 11A showing a ceramic substrate 140, the facing surface may be divided into three to provide three zones and three conductors 141A, 141B, and 141C may be embedded in the three zones, respectively, or as shown in FIG. 11B showing a ceramic substrate 240, the facing surface may be divided into five to provide five zones and five conductors 241A to 241E may be embedded in the five zones, respectively.

Figure 12A:
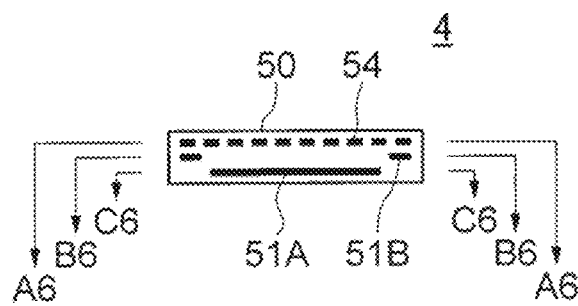
FIG. 12A is a schematic vertical cross section of a showerhead according to a fifth embodiment.

Hereinafter, showerhead 4 according to a fifth embodiment of the present disclosure will be described with reference to FIGS. 12A and 12B. As shown in FIG. 12A, showerhead 4 according to the fifth embodiment, as well as the fourth embodiment, includes a ceramic substrate 50 having a single heat generating resistor 54 embedded therein at a layer closer to a surface of the ceramic substrate opposite to the facing surface than the central portion of the ceramic substrate as seen in the direction of the thickness of the ceramic substrate, and in addition, two conductors 51A and 51B embedded as an upper electrode of RF electrodes in ceramic substrate 50 at different layers, respectively, as seen in the direction of the thickness of the ceramic substrate.

Figure 12B:
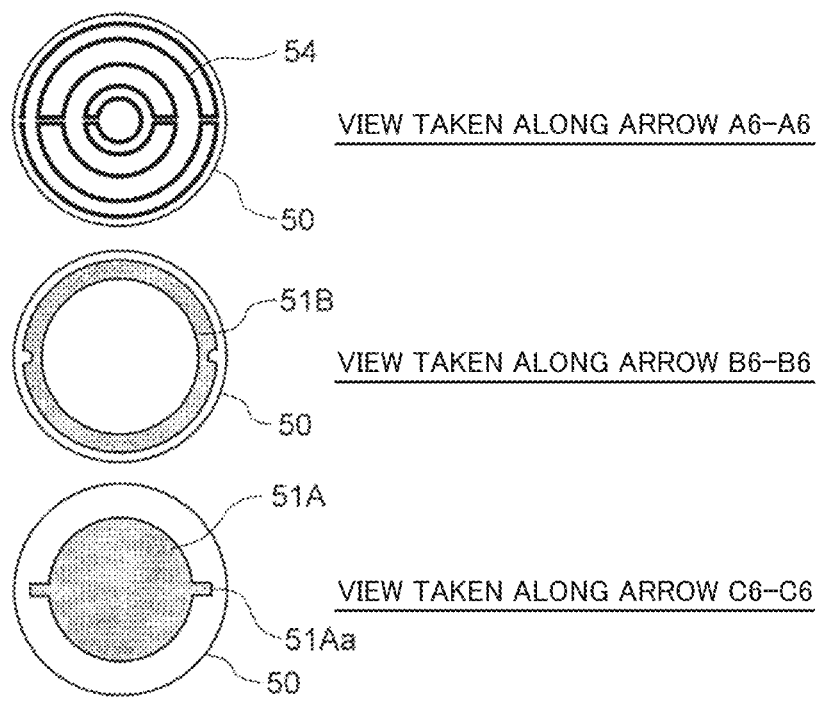
FIG. 12B shows the FIG. 12A showerhead cut along a line A6-A6 and viewed along the arrow, that cut along a line B6-B6 and viewed along the arrow, and that cut along a line C6-C6 and viewed along the arrow.
Figure 13A:
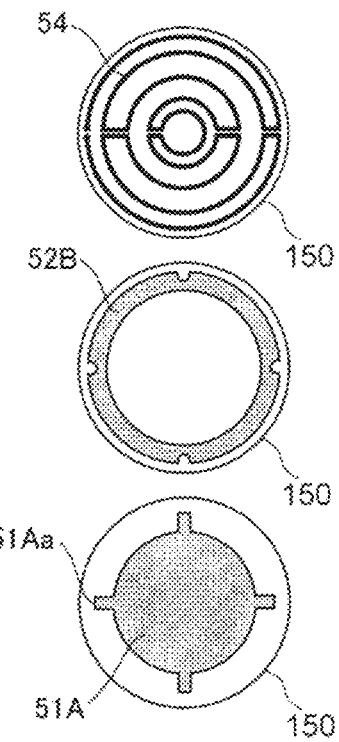
FIG. 13A is an example of an alternative to the showerhead of the fifth embodiment in a view along an arrow, similarly as seen in FIG. 12B.
Figure 13B:
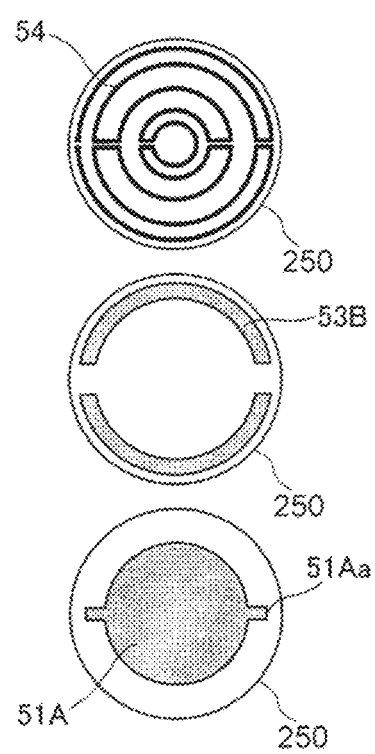
FIG. 13B is an example of an alternative to the showerhead of the fifth embodiment in a view along an arrow, similarly as seen in FIG. 12B.
Figure 13C:
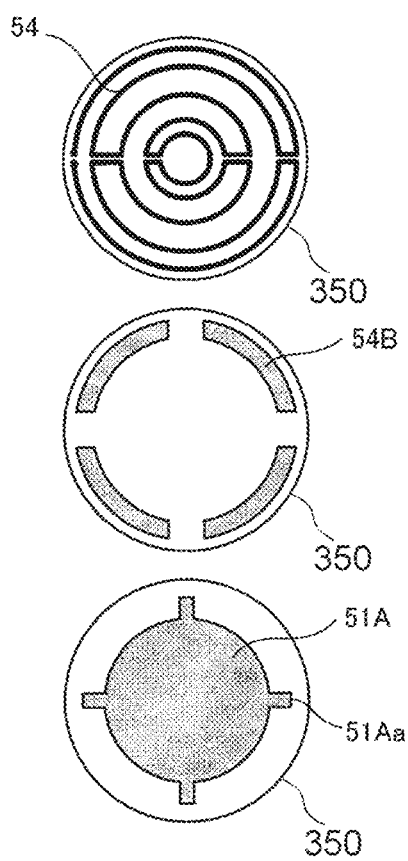
FIG. 13C is an example of an alternative to the showerhead of the fifth embodiment in a view along an arrow, similarly as seen in FIG. 12B.

That is, as shown in FIG. 12B, inner conductor 51A disposed in ceramic substrate 50 on the side of the center portion thereof and having a generally circular shape is embedded in ceramic substrate 50 at a layer closer to the facing surface than a central portion of the ceramic substrate as seen in the direction of the thickness of the ceramic substrate. In contrast, outer conductor 51B disposed in ceramic substrate 50 on an outer circumferential side and having an annular shape is embedded in ceramic substrate 50 at a layer located between a layer in which heat generating resistor 54 is embedded and a layer in which conductor 51A is embedded.

Conductors 51A and 51B are fed with power via a terminal portion (not shown), which is provided at a circumferential portion of ceramic substrate 50, as has been set forth above, and accordingly, conductor 51A is provided with two protrusions 51Aa protruding radially outward for electrical connection therewith. The showerhead of the fifth embodiment has two conductors embedded in different layers, respectively, and protrusion 51Aa never interferes with outer conductor 51B physically. Note, however, that to avoid interfering with the terminal portion connected to protrusion 51Aa, an outer circumferential portion of outer conductor 51B that corresponds thereto is notched to have a curved shape.

While the showerhead according to the firth embodiment described above has inner conductor 51A provided with two protrusions 51Aa, the showerhead is not limited as such, and, as shown in FIG. 12A showing a ceramic substrate 150, the inner conductor may have four protrusions equidistant in the circumferential direction to be able to more stably receive power. Further, the outer conductor is not limited to the above annular shape, either, and, as shown in FIG. 12B showing a ceramic substrate 250, the annular shape may be divided into two in the circumferential direction, or, as shown in FIG. 12C showing a ceramic substrate 350, the annular shape may be divided into four in the circumferential direction.

Example 0.5 parts by mass of yttrium oxide as a sintering aid was added to 99.5 parts by mass of aluminum nitride powder and a binder and an organic solvent were further added thereto, and a ball mill was used to mix them together to prepare slurry. The obtained slurry was sprayed in a spray dry method to prepare granules which were in turn press-formed to prepare two identically formed bodies. The formed bodies were degreased at 700° C. in a nitrogen atmosphere and then sintered at 1850° C. in a nitrogen atmosphere to provide two sintered aluminum nitride bodies. The obtained sintered bodies were each processed into a disk having a diameter of 380 mm and a thickness of 5 mm.

A W paste was applied to one side of one of these two sintered aluminum nitride bodies by screen-printing to form inner conductor 11A and outer conductors 11B and 11C shown in FIG. 2B and subsequently the aluminum nitride body was degreased in a nitrogen atmosphere at 700° C. and thereafter fired in a nitrogen atmosphere at 1830° C. An adhesive material containing aluminum nitride as a main component for adhesion was applied to one side of the other sintered body and the other sintered body was degreased. These two sintered aluminum nitride bodies were joined and thus bonded such that conductors 11A to 11C were inside.

The thus bonded body was machined and thus perforated to have a plurality of gas discharging holes 10a having an inner diameter of 1.0 mm and arranged in a pattern as shown in FIG. 1A. Furthermore, the body had a circumferential portion processed to have a counterbored hole each reaching protrusion 11Aa of inner conductor 11A and outer conductors 11B and 11C, and an electrode terminal portion made of W was fitted therein and thus electrically connected to each conductor. A showerhead of sample 1 was thus fabricated.

For comparison, a showerhead of sample 2 was fabricated in the same manner as described above except that, instead of conductors 11A to 11C, a single circular conductor having an area equal to that of the total of conductors 11A to 11C was formed and the single conductor had a circumferential portion with four electrode terminal portions electrically connected thereto equidistantly in the circumferential direction.

The showerheads of samples 1 and 2 were each placed in a chamber of a semiconductor manufacturing apparatus and a deposition process was performed through plasma CVD. When the showerhead of sample 2 was used, a layer of film deposited closer to a side provided with a load lock was thin in thickness. It is believed that this is because the load lock has an effect to reduce temperature or a plasma in density on the side of the load lock. Even when the showerhead of sample 1 was used, the same tendency as sample 1 was observed, and accordingly, voltage or frequency applied to conductor 11B located on the side of the load lock was adjusted to increase the plasma's density on the side of the load lock, and this allowed a wafer to entirely have a layer of film deposited thereon substantially uniformly in thickness.

It should be understood that the embodiments disclosed herein have been described for the purpose of illustration only and in a non-restrictive manner in any respect. Note that the present invention is not limited to these examples, and is intended to include any modifications within the meaning and scope indicated by and equivalent to the terms of the claims.

REFERENCE SIGNS LIST

1: semiconductor manufacturing apparatus
2: semiconductor wafer
3: chamber
4: showerhead
5: terminal portion
8: wafer holder
9: wafer carrying surface
10, 20, 30, 40, 50, 110, 120, 130, 140, 150, 210, 220, 230, 240, 310, 320, 350, 410, 420, 520, 620, 720: ceramic substrate
10a: gas discharging hole
11A, 111A, 21A, 31A, 421A, 141A, 241A, 51A: inner conductor
11B, 11C, 111B, 111C, 111D, 111E, 21B, 22B, 23B, 24B, 421B, 422B, 423B, 424B, 31B, 32B, 33B, 34B, 141B, 141C, 241B, 241C, 241D, 241E, 51B, 52B, 53B, 54B: outer conductor
211A, 211B, 211C, 211D, 311A, 311B, 311C, 311D, 311E, 311F, 411A, 411B, 411C, 411D, 411E, 411F, 411G, 411H: conductor
11Aa, 21Aa, 32a, 51Aa, 111Aa, 421Aa: protrusion
32: lead-out portion
33: connecting portion
44, 54: resistive, heat generating element

The invention claimed is:

1. A showerhead provided in a chamber of a semiconductor manufacturing apparatus and facing a wafer holder, comprising:
a plate-shaped ceramic substrate, the ceramic substrate having a circular shape;
a plurality of through holes penetrating the ceramic substrate in a direction of a thickness of the ceramic substrate; and
a plurality of radio frequency conductors,
wherein the ceramic substrate is divided into a plurality of zones as seen on a side of a surface of the ceramic substrate facing the wafer holder,
the plurality of conductors are embedded in the plurality of zones, respectively, and
the plurality of zones divide the circular shape into a center portion and an annular portion disposed around the center portion or divides the circular shape into a plurality of portions along a circumferential direction.

2. The showerhead according to claim 1, wherein the plurality of conductors are embedded in the ceramic substrate at different positions, respectively, as seen in the direction of the thickness of the ceramic substrate.

3. The showerhead according to claim 1, further comprising: a lead-out circuit embedded in the ceramic substrate at a position different from that of at least one of the plurality of conductors as seen in the direction of the thickness of the ceramic substrate, and electrically connected to the at least one conductor; and a terminal portion disposed at a circumferential portion of the ceramic substrate and electrically connected to the at least one conductor via the lead-out circuit.

4. The showerhead according to claim 1, further comprising a resistive, heat generating element embedded in the ceramic substrate.

5. The showerhead according to claim 4, wherein the resistive, heat generating element is embedded in the ceramic substrate at a position different from that of at least one of the plurality of conductors as seen in the direction of the thickness of the ceramic substrate.

6. The showerhead according to claim 1,
wherein each of the plurality of conductors is fed with power at a portion embedded in a peripheral portion of the ceramic substrate.

7. The showerhead according to claim 1,
wherein the plurality of zones include a first zone disposed at the center portion, and
one of the plurality of conductors embedded in the first zone has a protrusion led out from the center portion toward a periphery of the circular shape, and is fed with power at the protrusion.

8. The showerhead according to claim 7,
wherein the plurality of zones include a plurality of second zones disposed at the annular portion, and
the protrusion is disposed between two of the plurality of conductors embedded in the plurality of second zones and adjacent to each other, and is on the same plane with the one of the plurality of conductors embedded in the first zone.

* * * * *